(12) United States Patent
Yang et al.

(10) Patent No.: US 7,582,522 B2
(45) Date of Patent: *Sep. 1, 2009

(54) METHOD AND DEVICE FOR CMOS IMAGE SENSING WITH SEPARATE SOURCE FORMATION

(75) Inventors: Jianping Yang, Shanghai (CN); Chunyan Xin, Shanghai (CN); Jieguang Huo, Shanghai (CN); Yanyong Wang, Guangdong (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 11/959,350

(22) Filed: Dec. 18, 2007

(65) Prior Publication Data

US 2008/0128770 A1 Jun. 5, 2008

Related U.S. Application Data

(63) Continuation of application No. 11/185,444, filed on Jul. 19, 2005, now Pat. No. 7,335,546.

(30) Foreign Application Priority Data

Jun. 28, 2005 (CN) .......................... 2005 1 0027511

(51) Int. Cl.
*H01L 21/8238* (2006.01)
*H01L 31/00* (2006.01)
(52) U.S. Cl. ...................... 438/200; 438/228; 257/371; 257/E31.001

(58) Field of Classification Search ................. 438/200, 438/228; 257/371, E31.001, E31.002
See application file for complete search history.

(56) References Cited

U.S. PATENT DOCUMENTS

| | | | |
|---|---|---|---|
| 5,101,253 A | 3/1992 | Mizutani et al. | |
| 5,789,774 A | 8/1998 | Merrill | |
| 5,942,775 A | 8/1999 | Yiannoulos | |
| 6,177,293 B1 | 1/2001 | Netzer et al. | |
| 6,306,678 B1 | 10/2001 | Chiang et al. | |
| 6,329,218 B1 * | 12/2001 | Pan ............................. | 438/57 |
| 6,495,391 B1 | 12/2001 | Chan | |
| 6,617,174 B2 | 9/2003 | Rotstein | |
| 6,743,652 B2 * | 6/2004 | Thomas et al. ................. | 438/48 |
| 6,894,268 B2 * | 5/2005 | Ohkawa .................. | 250/214.1 |
| 7,335,546 B2 * | 2/2008 | Yang et al. .................. | 438/200 |
| 2003/0148574 A1 * | 8/2003 | Thomas et al. .............. | 438/201 |

* cited by examiner

*Primary Examiner*—Lex Malsawma
(74) *Attorney, Agent, or Firm*—Townsend and Townsend and Crew LLP

(57) ABSTRACT

A method and device for image sensing. The method includes forming a first well and a second well in a substrate, forming a gate oxide layer on the substrate, and depositing a first gate region and a second gate region on the gate oxide layer. The first gate region is associated with the first well, and the second gate region is associated with the second well. Additionally, the method includes forming a third well in the substrate, implanting a first plurality of ions to form a first lightly doped source region and a first lightly doped drain region in the first well, implanting a second plurality of ions to form at least a second lightly doped drain region in the second well, and implanting a third plurality of ions to form a source in the second well.

18 Claims, 8 Drawing Sheets

METHOD AND DEVICE FOR CMOS IMAGE SENSING WITH SEPARATE SOURCE FORMATION

CROSS-REFERENCES TO RELATED APPLICATIONS

This application is a continuation of U.S. application Ser. No. 11/185,444, filed Jul. 19, 2005 which claims priority to Chinese Patent Application No. 200510027511.3, filed Jun. 28, 2005. Both applications are commonly assigned and incorporated by reference herein for all purposes.

BACKGROUND OF THE INVENTION

The present invention is directed to integrated circuits and their processing for the manufacture of semiconductor devices. More particularly, the invention provides a method and device with separate source formation. Merely by way of example, the invention has been applied to CMOS image sensing. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. One such type of IC is a CMOS imaging system. The CMOS imaging system can be fabricated on standard silicon production lines and therefore inexpensive to make. Additionally, the CMOS image sensor consumes low power and especially suitable for portable applications.

Specifically, a CMOS image sensor converts a light signal into an electrical signal, whose intensity is related to the light intensity. FIG. 1 is a simplified diagram for a conventional CMOS image sensor. The CMOS image sensor 100 corresponds to one pixel and includes a reset transistor 110, a photodiode 120, a source follower 130, a selecting transistor 140, and a bias resistor 150. The photodiode 120 receives a light signal and generates a photocurrent from a node 160 to a node 162. Additionally, a leakage current also flows through the photodiode 120 in the same direction. One source for the leakage current is the source region of the reset transistor 110, which is connected to the photodiode 120.

FIG. 2 is a simplified conventional diagram for the reset transistor 110 and the photodiode 120. The photodiode 120 includes an active region 210, and the reset transistor 110 includes a source region 220, a drain region 230, and a gate region 240. The source region 220 forms a junction with the substrate or a well in the substrate, and the junction usually experiences certain leakage. The leakage is usually passed to the active region 210 and contributes to the leakage current of the photodiode 120. A large leakage current adversely affects the performance of the CMOS image sensor.

FIG. 3 is another simplified convention diagram for the reset transistor 110 and the photodiode 120. The photodiode 120 includes a diode diffusion region 310 formed under a field oxide region 320. The reset transistor 110 includes a source region 330, a drain region 340, and a gate region 350. The source region 330 is connected to the diode diffusion region 310 and formed with a deep source implantation penetrating the gate region 350. The gate region 350 is not aligned with the source region, so the reliability of the CMOS image sensor usually deteriorates.

From the above, it is seen that an improved technique for CMOS image sensor is desired.

BRIEF SUMMARY OF THE INVENTION

The present invention is directed to integrated circuits and their processing for the manufacture of semiconductor devices. More particularly, the invention provides a method and device with separate source formation. Merely by way of example, the invention has been applied to CMOS image sensing. But it would be recognized that the invention has a much broader range of applicability.

In a specific embodiment, the invention provides a method for making an image sensor. The method includes forming a first well and a second well in a substrate, forming a gate oxide layer on the substrate, and depositing a first gate region and a second gate region on the gate oxide layer. The first gate region is associated with the first well, and the second gate region is associated with the second well. Additionally, the method includes forming a third well in the substrate, implanting a first plurality of ions to form a first lightly doped source region and a first lightly doped drain region in the first well, implanting a second plurality of ions to form at least a second lightly doped drain region in the second well, and implanting a third plurality of ions to form a source in the second well. The first well and the second well are associated with a CMOS, and the third well is associated with a photodiode. The implanting a second plurality of ions and the implanting a third plurality of ions are two separate processes. The implanting a third plurality of ions is associated with a first implant energy ranging from 40 KeV to 80 KeV and a first implant dose ranging from $10^3$ cm$^{-2}$ to $10^5$ cm$^{-2}$.

According to another embodiment of the present invention, a method for making an image sensor includes forming a first well and a second well in a substrate, forming a gate oxide layer on the substrate, and depositing a first gate region and a second gate region on the gate oxide layer. The first gate region is associated with the first well, and the second gate region is associated with the second well. Additionally, the method includes forming a third well in the substrate, implanting a first plurality of ions to form a first lightly doped source region and a first lightly doped drain region in the first well, implanting a second plurality of ions to form a second lightly doped drain region and a second lightly doped source region in the second well, forming a first spacer and a second spacer associated with the second gate region, and implanting a third plurality of ions to form a second source in the second well. The first well and the second well are associated with a CMOS, and the third well is associated with a photodiode. The forming a first spacer and a second spacer is performed after the implanting a second plurality of ions, and the forming a first spacer and a second spacer is performed prior to the implanting a third plurality of ions.

According to yet another embodiment of the present invention, a device for image sensing includes a semiconductor substrate. Additionally, the device includes a first well, a second well, and a third well in the semiconductor substrate. The first well and the second well are associated with a CMOS, and the third well is associated with a photodiode. Moreover, the device includes a gate oxide layer on the semiconductor substrate including the third well. Also, the device includes a first gate region and a second gate region on the gate oxide. The first gate region and the second gate region are associated with the first well and the second well respectively. Additionally, the device includes a first spacer and a second spacer adjacent to the second gate region, a first lightly doped drain region in the second well and associated with the second gate region, a first heavily doped drain region in the second well and associated with the first lightly doped drain region, and a first source in the second well and associated with the second gate region. The first lightly doped drain region is substantially self-aligned with the second gate region. The first heavily doped drain region is associated with a first depth, and the source is associated with a second depth. The second depth is different from the first depth.

Many benefits are achieved by way of the present invention over conventional techniques. For example, the present technique provides an easy to use process that relies upon conventional technology. Some embodiments of the present invention provide a separate ion implantation process for forming a source connected to a photodiode. The separate ion implantation process may have adjustable implant energy, implant dose, and anneal conditions. Certain embodiments of the present invention improve signal-to-source ratio and reduce source junction leakage current by providing a separation ion implantation process for forming the source and using an implant dose lower than the implant dose used for forming a heavily doped source region. Some embodiments of the present invention provide a source that is substantially self-aligned with a spacer and connected to a photodiode. Certain embodiments of the present invention improve uniformity of CMOS gate-to-source capacitance and reduce the gate-to-source capacitance and the source sheet resistance. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. More particularly, the invention provides a method and device with separate source formation. Merely by way of example, the invention has been applied to CMOS image sensing. But it would be recognized that the invention has a much broader range of applicability.

Figure 1:
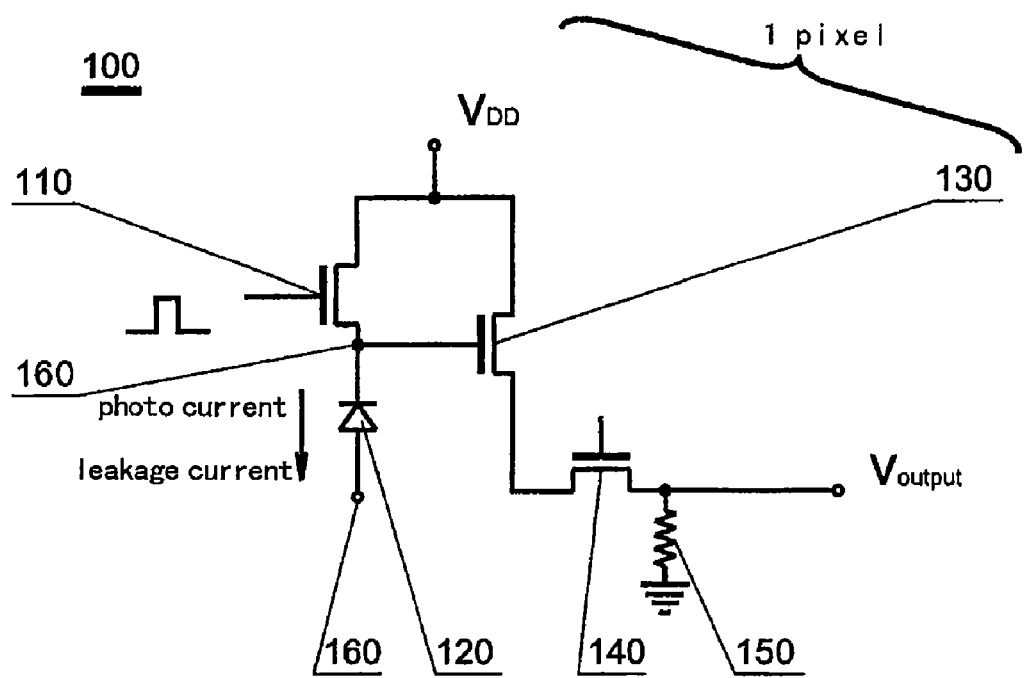
FIG. 1 is a simplified diagram for a conventional CMOS image sensor.
Figure 2:
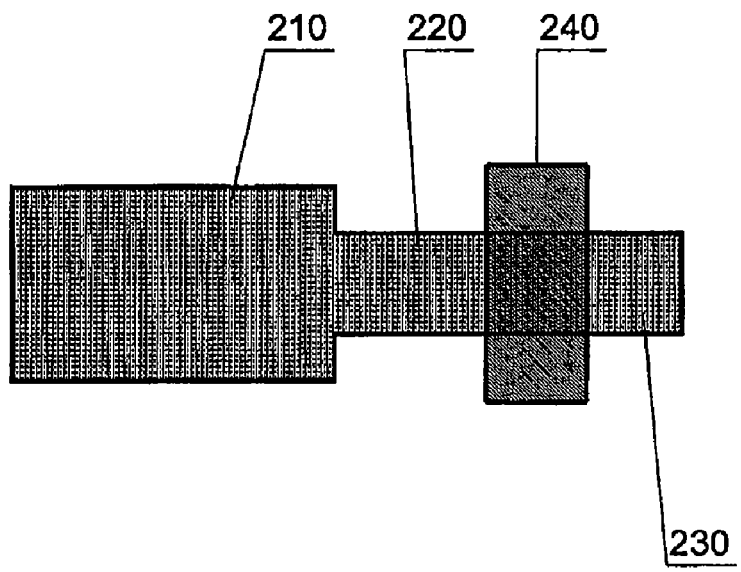
FIG. 2 is a simplified conventional diagram for a reset transistor and a photodiode.
Figure 3:
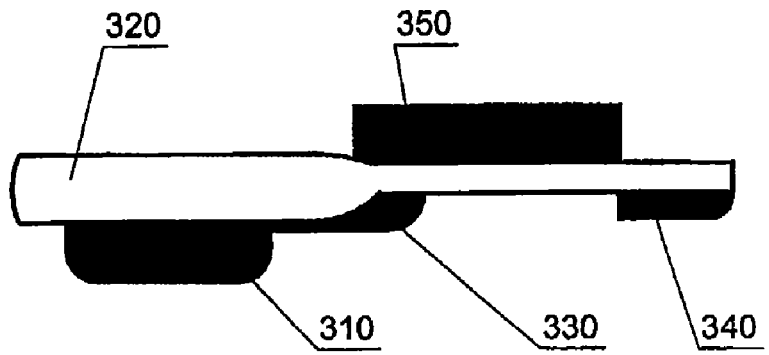
FIG. 3 is another simplified convention diagram for a reset transistor and a photodiode.
Figure 4:
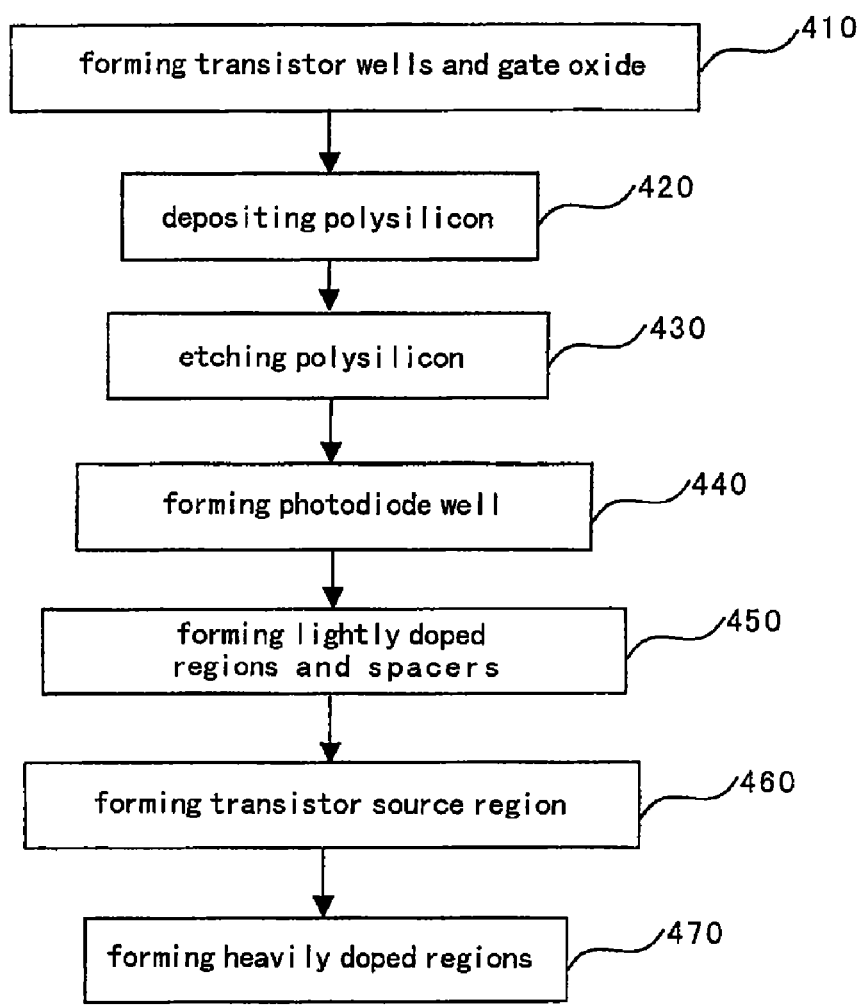
FIG. 4 is a simplified method for forming image sensor according to an embodiment of the present invention.

FIG. 4 is a simplified method for forming image sensor according to an embodiment of the present invention. The method 400 includes the following processes:

1. Process 410 for forming transistor wells and gate oxide;
2. Process 420 for depositing polysilicon;
3. Process 430 for etching polysilicon;
4. Process 440 for forming photodiode well;
5. Process 450 for forming lightly doped regions and spacers;
6. Process 460 for forming transistor source region;
7. Process 470 for forming heavily doped regions.

The above sequence of processes provides a method according to an embodiment of the present invention. Other alternatives can also be provided where processes are added, one or more processes are removed, or one or more processes are provided in a different sequence without departing from the scope of the claims herein. For example, additional processes are provided to form a source follower, a selecting transistor, and a bias resistor. Future details of the present invention can be found throughout the present specification and more particularly below.

Figure 5:
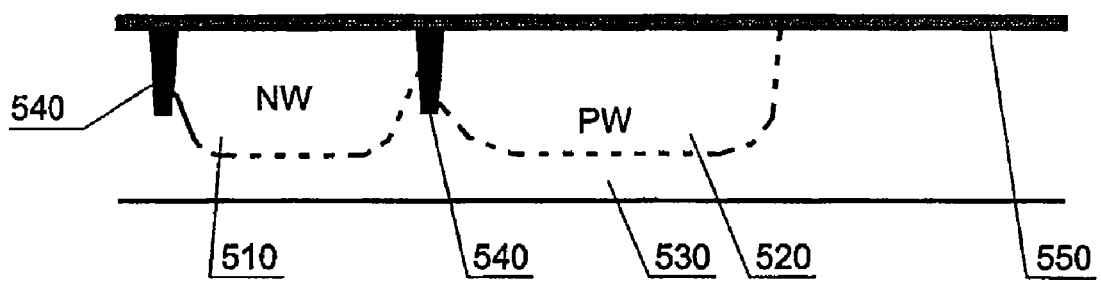
FIG. 5 shows a process for well and oxide formation according to an embodiment of the present invention.

At the process 410, transistor wells and a gate oxide layer are formed. FIG. 5 shows process 410 for well and oxide formation according to an embodiment of the present invention. This diagram is merely an example, which should not unduly limit the scope of the claims. One of ordinary skill in the art would recognize many variations, alternatives, and modifications.

As shown in FIG. 5, an n-type well 510 and a p-type well 520 are formed in a semiconductor substrate 530. In one embodiment, the wells 510 and 520 are at least in part confined by shallow trench isolations 540. In another embodiment, the n-type well 510 and the p-type well 520 are formed with ion implantation processes and/or diffusion processes. The n-type dopants may be arsenic and/or phosphorous, and the p-type dopants may be boron. In yet another embodiment, the depth of the n-type well 510 ranges from 0.5 µm to 1.0 µm, and the doping concentration of the n-type well 510 ranges from $5 \times 10^{16}$ cm$^{-3}$ to $3 \times 10^{17}$ cm$^{-3}$. The depth of the p-type well 520 ranges from 0.5 µm to 1.0 µm, and the doping concentration of the p-type well 510 ranges from $5 \times 10^{16}$ cm$^{-3}$ to $3 \times 10^{17}$ cm$^{-3}$. In yet another embodiment, the semiconductor substrate 530 is a silicon substrate.

Also shown in FIG. 5, a gate oxide layer 550 is formed on the semiconductor substrate 530. In one embodiment, the gate oxide layer 550 includes silicon oxide. The gate oxide layer 550 is grown or deposited. In another embodiment, the thickness of the oxide layer 550 ranges from 150 Å to 400 Å.

Figure 6:
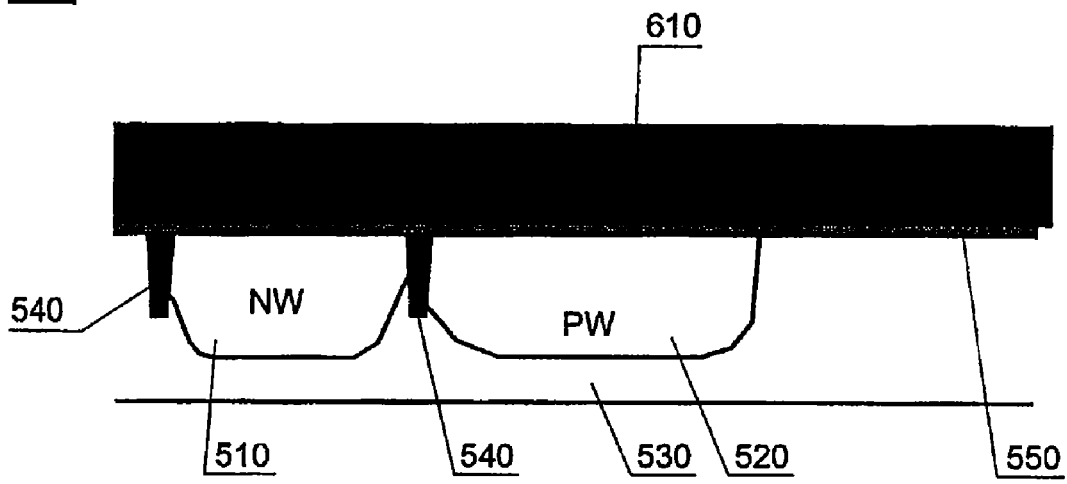
FIG. 6 shows a process for polysilicon deposition according to an embodiment of the present invention.

At the process 420, a polysilicon layer is deposited. FIG. 6 shows process 420 for polysilicon deposition according to an embodiment of the present invention. This diagram is merely an example, which should not unduly limit the scope of the claims. One of ordinary skill in the art would recognize many variations, alternatives, and modifications. As shown in FIG. 6, a polysilicon layer 610 is deposited on the gate oxide layer 550. In one embodiment, the deposition includes chemical vapor deposition, low pressure chemical vapor deposition, plasma enhanced chemical vapor deposition, and/or sputtering deposition. In another embodiment, the thickness of the polysilicon layer 610 ranges from 1800 Å to 2200 Å. In yet another embodiment, the polysilicon layer 610 is doped either n-type or p-type. The dopant concentration may range from $1 \times 10^{18}$ cm$^{-3}$ to $4 \times 10^{19}$ cm$^{-3}$.

Figure 7:
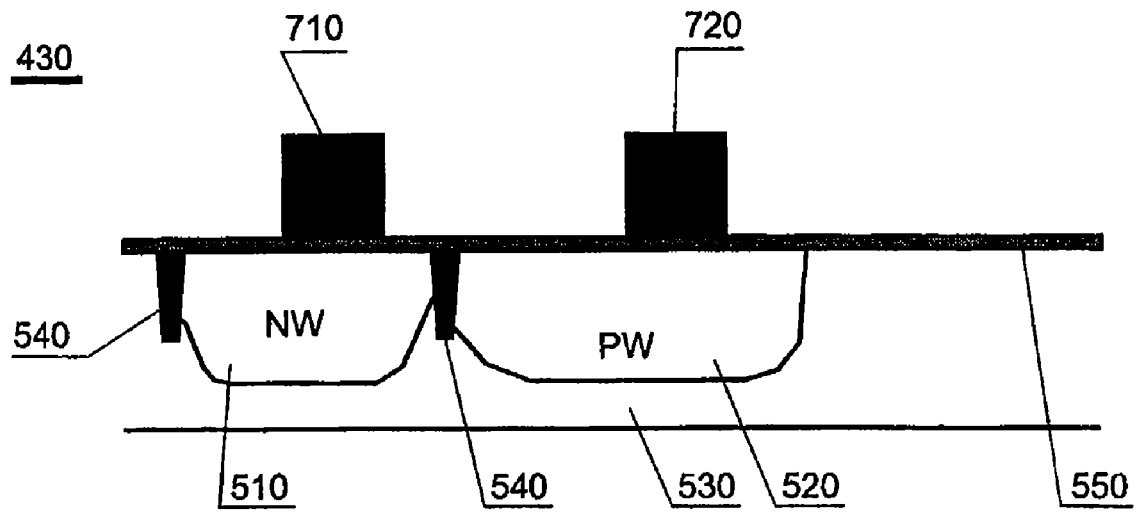
FIG. 7 shows a process for polysilicon etching according to an embodiment of the present invention.

At the process 430, the polysilicon layer 610 is etched. FIG. 7 shows process 430 for polysilicon etching according to an embodiment of the present invention. This diagram is merely an example, which should not unduly limit the scope of the claims. One of ordinary skill in the art would recognize many variations, alternatives, and modifications. As shown in FIG. 7, the polysilicon layer 610 is selectively etched to form polysilicon gates 710 and 720. The etching process may include a dry etch and/or a wet etch. In one embodiment, the polysilicon gate 710 is located on the n-type well 510, and the polysilicon gate 720 is located on the p-type well 520.

Figure 8:
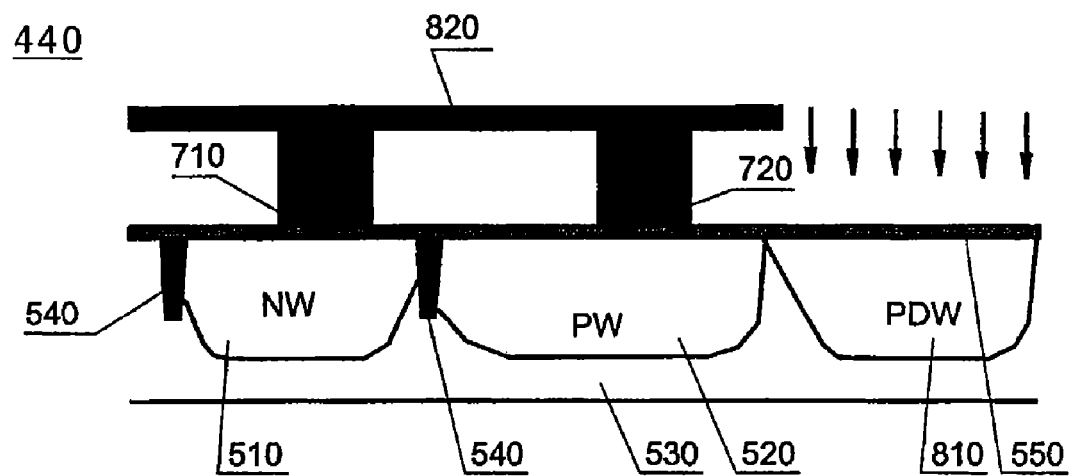
FIG. 8 shows a process for photodiode well formation according to an embodiment of the present invention.

At the process 440, a photodiode well is formed. FIG. 8 shows process 440 for photodiode well formation according to an embodiment of the present invention. This diagram is merely an example, which should not unduly limit the scope of the claims. One of ordinary skill in the art would recognize many variations, alternatives, and modifications. As shown in FIG. 8, a photodiode well 810 is formed in the semiconductor substrate 530. In one embodiment, the photodiode well 810 has p-type conductivity. In another embodiment, the photodiode well 810 is formed with an ion implantation process through the gate oxide layer 550. For example, the implant energy ranges from 100 KeV to 250 KeV, and the dose ranges from $10^{12}$ to $10^{14}$ cm$^{-2}$. As another example, the ion implantation process is performed with a barrier layer. The barrier layer may be patterned by a photolithography process using a photo mask 820. As shown in FIG. 8, the barrier layer can substantially block any implanted ion from entering the n-type and p-type wells 510 and 520. For example, the barrier layer includes photoresist.

Figure 9:
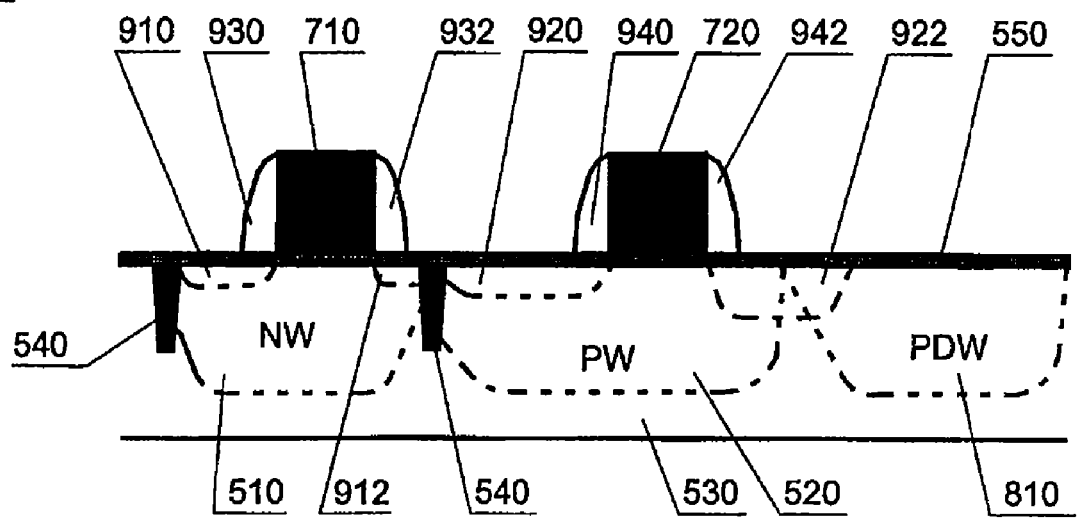
FIG. 9 shows a process for forming lightly doped regions and spacers according to an embodiment of the present invention.

At the process 450, lightly doped regions and spacers are formed. FIG. 9 shows process 450 for forming lightly doped regions and spacers according to an embodiment of the present invention. This diagram is merely an example, which should not unduly limit the scope of the claims. One of ordinary skill in the art would recognize many variations, alternatives, and modifications. As shown in FIG. 9, lightly doped regions 910 and 912 are formed on both sides of the gate region 710, and lightly doped regions 920 and 922 are formed on both sides of the gate region 720. In one embodiment, the regions 910 and 912 are p-type, and the regions 920 and 922 are n-type. The region 920 is separated from the region 912 by a shallow trench isolation 540. In another embodiment, the depth for the lightly doped region 910 or 912 ranges from 500 Å to 1500 Å, and the dopant concentration ranges from $1 \times 10^{17}$ cm$^{-3}$ to $3 \times 10^{18}$ cm$^{-3}$. The depth for the lightly doped regions 920 or 922 ranges from 500 Å to 1500 Å, and the dopant concentration ranges from $1 \times 10^{17}$ cm$^{-3}$ to $3 \times 10^{18}$ cm$^{-3}$. In yet another embodiment, the lightly doped regions 910 and 912 each are used as a lightly doped source or drain region. The lightly doped regions 920 and 922 are used as a lightly doped drain region and a lightly doped source region respectively. In yet another embodiment, the lightly doped regions 910, 912, 920 and 922 each are formed by ion implantation and/or diffusion. Also as shown in FIG. 9, spacers 930 and 932 are formed for the gate region 710, and spacers 940 and 942 are formed for the gate region 720. In one embodiment, the spacers 930 and 932 are on at least part of the lightly doped regions 910 and 912 respectively. The spacers 940 and 942 are on at least part of the lightly doped regions 920 and 922 respectively.

Figure 10:
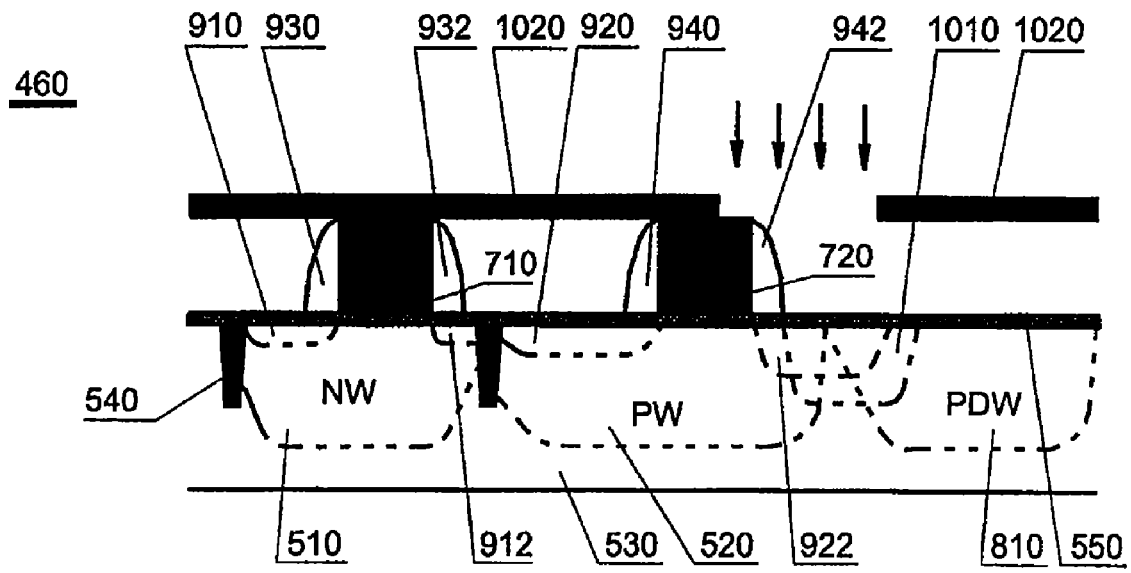
FIG. 10 shows a process for source region formation according to an embodiment of the present invention.

At the process 460, a source region is formed. FIG. 10 shows process 460 for source region formation according to an embodiment of the present invention. This diagram is merely an example, which should not unduly limit the scope of the claims. One of ordinary skill in the art would recognize many variations, alternatives, and modifications. As shown in FIG. 10, a source region 1010 is formed in the semiconductor substrate 530. In one embodiment, the source region 1010 is formed with an ion implantation process through the gate oxide layer 550. For example, the implant energy ranges from 40 KeV to 80 KeV, and the dose ranges from $10^3$ to $10^5$ cm$^{-2}$. As another example, the ion implantation process is performed with a barrier layer. The barrier layer may be patterned by a photolithography process using a photo mask 1020. As shown in FIG. 10, the barrier layer, the gate region 720 and the spacer 942 can substantially block any implanted ion from entering the lightly doped regions 910, 912 and 920 and part of the lightly doped region 922. For example, the barrier layer includes photoresist.

Figure 11:
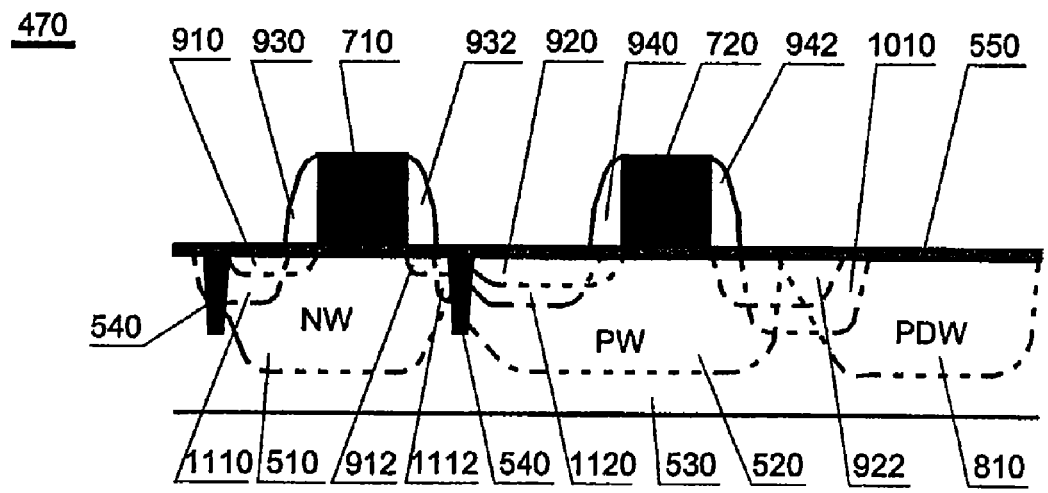
FIG. 11 shows a process for forming heavily doped regions according to an embodiment of the present invention.

At the process 470, heavily doped regions are formed. FIG. 11 shows process 470 for forming heavily doped regions according to an embodiment of the present invention. This diagram is merely an example, which should not unduly limit the scope of the claims. One of ordinary skill in the art would recognize many variations, alternatives, and modifications. As shown in FIG. 11, heavily doped regions 1110 and 1112 are formed on both sides of the gate region 710, and a heavily doped region 1120 is formed on only one side of the gate region 720. In one embodiment, the regions 1110 and 1112 are p-type, and the region 1120 is n-type. The region 1120 is separated from the region 1112 by a shallow trench isolation 540. In another embodiment, the depth for the heavily doped region 1110 or 1112 ranges from 500 Å to 2000 Å, and the dopant concentration ranges from $1 \times 10^{18}$ cm$^{-3}$ to $2 \times 10^{19}$ cm$^{-3}$. The depth for the heavily doped region 1120 ranges from 500 Å to 2000 Å, and the dopant concentration ranges from $1 \times 10^{18}$ cm$^{-3}$ to $2 \times 10^{19}$ cm$^{-3}$. In yet another embodiment, the heavily doped regions 1110 and 1112 each are used as a heavily doped source or drain region. The heavily doped region 1120 is used as a heavily doped drain region. In yet another embodiment, the heavily doped regions 1110, 1112 and 1120 each are formed by ion implantation and/or diffusion.

As discussed above and further emphasized here, FIG. 4 is merely an example, which should not unduly limit the scope of the claims. One of ordinary skill in the art would recognize many variations, alternatives, and modifications. In another embodiment, the method 400 includes the following processes:

1. Process 410 for forming transistor wells and gate oxide;
2. Process 420 for depositing polysilicon;
3. Process 430 for etching polysilicon;
4. Process 440 for forming photodiode well;
5. Process 455 for forming lightly doped regions;
6. Process 465 for forming transistor source region and spacers;
7. Process 475 for forming heavily doped regions.

Figure 9A:
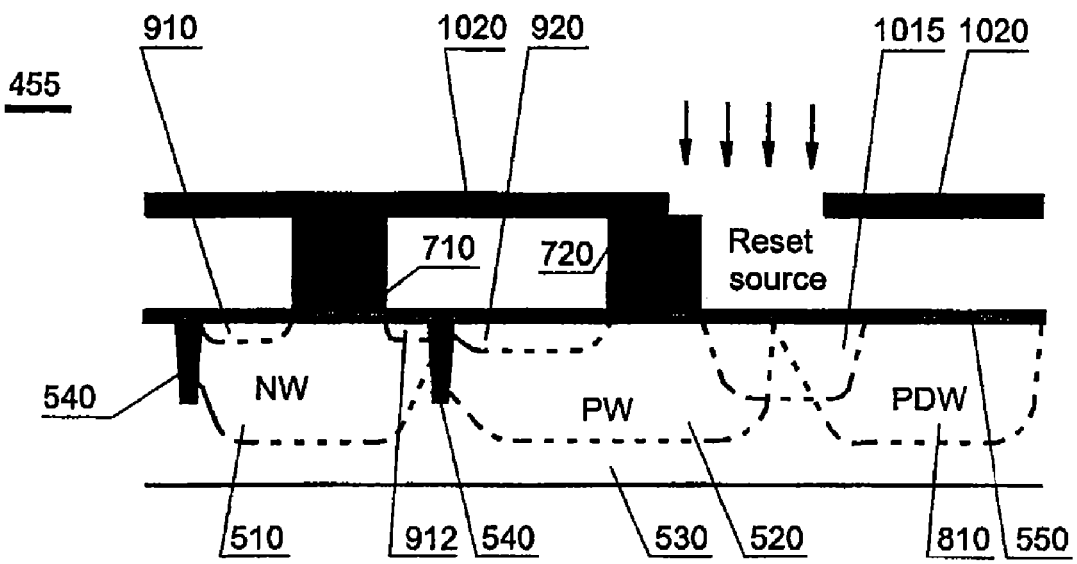
FIG. 9(a) shows a process for forming lightly doped regions according to another embodiment of the present invention.

At the process 455, lightly doped regions are formed. FIG. 9(a) shows process 455 for forming lightly doped regions according to another embodiment of the present invention. This diagram is merely an example, which should not unduly limit the scope of the claims. One of ordinary skill in the art would recognize many variations, alternatives, and modifications. As shown in FIG. 9(a), lightly doped regions 910 and 912 are formed on both sides of the gate region 710, and a lightly doped region 920 is formed on only one side of the gate region 720. In one embodiment, the regions 910 and 912 are p-type, and the region 920 is n-type. The region 920 is separated from the region 912 by a shallow trench isolation 540. In another embodiment, the depth for the lightly doped region 910 or 912 ranges from 500 Å to 1500 Å, and the dopant concentration ranges from $1\times10^{17}$ cm$^{-3}$ to $3\times10^{18}$ cm$^{-3}$. The depth for the lightly doped region 920 ranges from 500 Å to 1500 Å, and the dopant concentration ranges from $1\times10^{17}$ cm$^{-3}$ to $3\times10^{18}$ cm$^{-3}$. In yet another embodiment, the lightly doped regions 910 and 912 each are used as a lightly doped source or drain region. The lightly doped region 920 is used as a lightly doped drain region. In yet another embodiment, the lightly doped regions 910, 912 and 920 each are formed by ion implantation and/or diffusion.

Figure 10A:
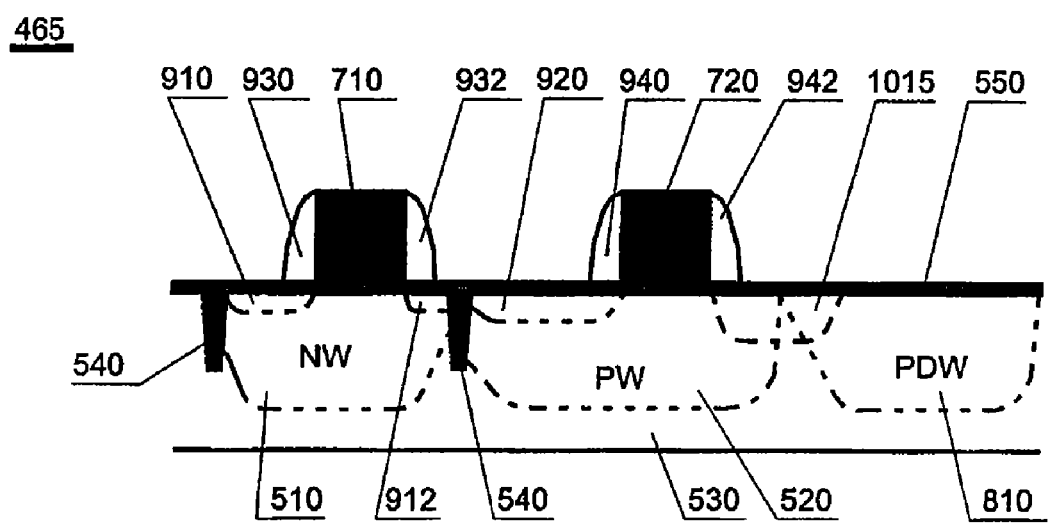
FIG. 10(a) shows a process for source region and spacer formation according to another embodiment of the present invention

At the process 465, a source region and spacers are formed. FIG. 10(a) shows process 465 for source region and spacer formation according to another embodiment of the present invention. This diagram is merely an example, which should not unduly limit the scope of the claims. One of ordinary skill in the art would recognize many variations, alternatives, and modifications. As shown in FIG. 10(a), a source region 1015 is formed in the semiconductor substrate 530. In one embodiment, the source region 1015 is formed with an ion implantation process through the gate oxide layer 550. For example, the implant energy ranges from 40 KeV to 80 KeV, and the dose ranges from $10^3$ to $10^5$ cm$^{-2}$. As another example, the ion implantation process is performed with a barrier layer. The barrier layer may be patterned by a photolithography process using a photo mask 1020. As shown in FIG. 10(a), the barrier layer and the gate region 720 can substantially block any implanted ion from entering the lightly doped regions 910, 912 and 920. For example, the barrier layer includes photoresist. After the formation of the source region 1015, spacers 930 and 932 are formed for the gate region 710, and spacers 940 and 942 are formed for the gate region 720. In one embodiment, the spacers 930 and 932 are on at least part of the lightly doped regions 910 and 912 respectively. The spacers 940 and 942 are on at least part of the lightly doped region 920 and the source region 1015 respectively.

Figure 11A:
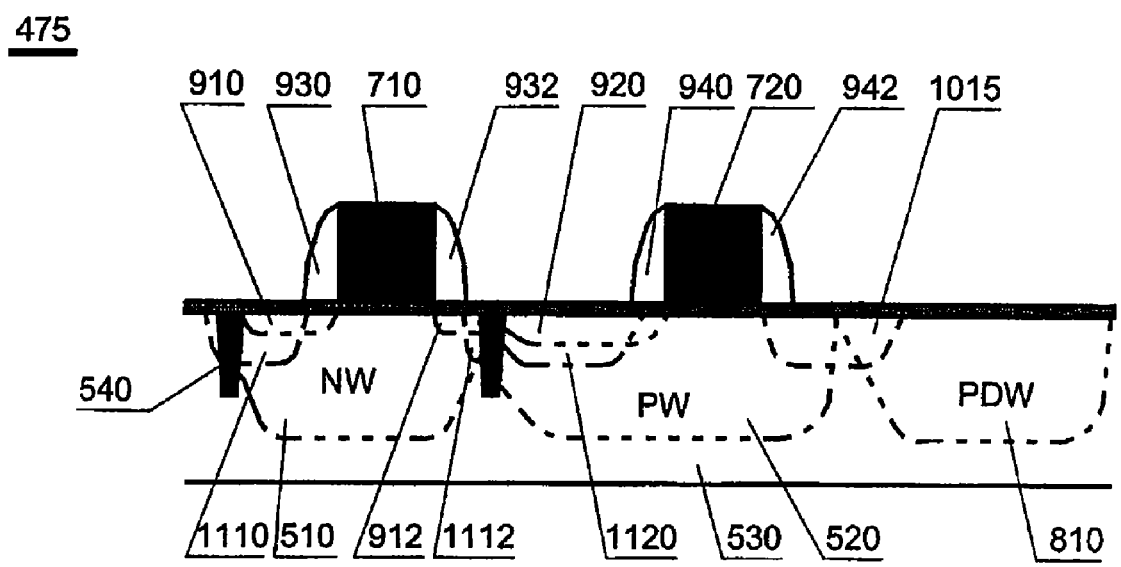
FIG. 11(a) shows a process for forming heavily doped regions according to another embodiment of the present invention

At the process 475, heavily doped regions are formed. FIG. 11(a) shows process 475 for forming heavily doped regions according to another embodiment of the present invention. This diagram is merely an example, which should not unduly limit the scope of the claims. One of ordinary skill in the art would recognize many variations, alternatives, and modifications. As shown in FIG. 11(a), heavily doped regions 1110 and 1112 are formed on both sides of the gate region 710, and a heavily doped region 1120 is formed on only one side of the gate region 720. In one embodiment, the regions 1110 and 1112 are p-type, and the region 1120 is n-type. The region 1120 is separated from the region 1112 by a shallow trench isolation 540. In another embodiment, the depth for the heavily doped region 1110 or 1112 ranges from 500 Å to 2000 Å, and the dopant concentration ranges from $1\times10^{18}$ cm$^{-3}$ to $2\times10^{19}$ cm$^{-3}$. The depth for the heavily doped region 1120 ranges from 500 Å to 2000 Å, and the dopant concentration ranges from $1\times10^{18}$ cm$^{-3}$ to $2\times10^{19}$ cm$^{-3}$. In yet another embodiment, the heavily doped regions 1110 and 1112 each are used as a heavily doped source or drain region. The heavily doped region 1120 is used as a heavily doped drain region. In yet another embodiment, the heavily doped regions 1110, 1112 and 1120 each are formed by ion implantation and/or diffusion.

Figure 12:
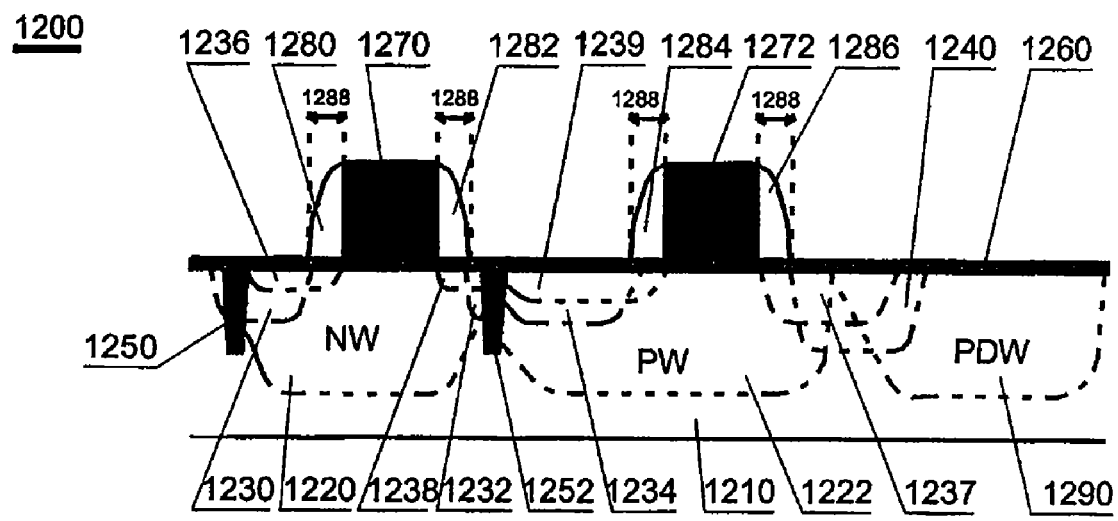
FIG. 12 is a simplified device for image sensing according to an embodiment of the present invention.

FIG. 12 is a simplified device for image sensing according to an embodiment of the present invention. The device 1200 includes the following components:

1. Substrate 1210;
2. Transistor wells 1220 and 1222;
3. Heavily doped regions 1230, 1232 and 1234;
4. Lightly doped regions 1236, 1237, 1238 and 1239;
5. Source region 1240;
6. Shallow trench isolations 1250 and 1252;
7. Gate oxide layer 1260;
8. Gate regions 1270 and 1272;
9. Spacers 1280, 1282, 1284, and 1286;
10. Photodiode well 1290.

The above group of components provide a device according to an embodiment of the present invention. Other alternatives can also be provided where components are added, one or more components are removed, or one or more components are provided in a different arrangement without departing from the scope of the claims herein. For example, a source follower, a selecting transistor, and a bias resistor are also provided to the device 1200. As another example, the device 1200 is fabricated according to the method 400 including at least the processes 450, 460 and 470. Future details of the present invention can be found throughout the present specification and more particularly below.

In one embodiment, the substrate 1210 is a semiconductor substrate, such as a silicon substrate. The transistor wells 1220 and 1222 are n-type and p-type respectively. For example, the depth of the n-type well 1220 ranges from 0.5 μm to 1.0 μm, and the doping concentration of the n-type well 1220 ranges from $5\times10^{16}$ cm$^{-3}$ to $3\times10^{17}$ cm$^{-3}$. The depth of the p-type well 1220 ranges from 0.5 μm to 1.0 μm, and the doping concentration of the p-type well 1222 ranges from $5\times10^{16}$ cm$^{-3}$ to $3\times10^{17}$ cm$^{-3}$.

The heavily doped regions 1230 and 1232 are formed on both sides of the gate region 1270 and are substantially self-aligned with the spacers 1280 and 1282 respectively. The heavily doped region 1234 is formed on only one side of the gate region 1272 and is substantially self-aligned with the spacer 1284. In one embodiment, the regions 1230 and 1232 are p-type, and the region 1234 is n-type. The region 1232 is separated from the region 1234 by the shallow trench isolation 1252. In another embodiment, the depth for the heavily doped region 1230 or 1232 ranges from 500 Å to 2000 Å, and the dopant concentration ranges from $1\times10^{18}$ cm$^{-3}$ to $2\times10^{19}$ cm$^{-3}$. The depth for the heavily doped region 1234 ranges from 500 Å to 2000 Å, and the dopant concentration ranges from $1\times10^{18}$ cm$^{-3}$ to $2\times10^{19}$ cm$^{-3}$.

The lightly doped regions 1236 and 1238 are located on both sides of the gate region 1270 and are substantially self-aligned with the gate region 1270. The lightly doped regions 1239 and 1237 are located on both sides of the gate region 1272 and are substantially aligned with the gate region 1272. In one embodiment, the regions 1236 and 1238 are p-type, and the regions 1239 and 1237 are n-type. The region 1238 is separated from the region 1239 by the shallow trench isolation 1252. In another embodiment, the depth for the lightly doped region 1236 or 1238 ranges from 500 Å to 1500 Å, and the dopant concentration ranges from $1\times10^{17}$ cm$^{-3}$ to $3\times10^{18}$ cm$^{-3}$. The depth for the lightly doped region 1239 or 1237 ranges from 500 Å to 1500 Å, and the dopant concentration ranges from $1\times10^{17}$ cm$^{-3}$ to $3\times10^{18}$ cm$^{-3}$.

The source region 1240 is located in the semiconductor substrate 1210. In one embodiment, the source region 1240 is n-type. The depth for the source region 1240 ranges from 2000 Å to 3500 Å, and the dopant concentration ranges from $1\times10^{18}$ cm$^{-3}$ to $1\times10^{19}$ cm$^{-3}$. In another embodiment, the depth of the source region 1240 is different from the depth of the lightly doped source region 1237 and/or the depth of the heavily doped source region 1234. In yet another embodiment, the depth of the source region 1240 is larger than the depth of the lightly doped source region 1237. In yet another embodiment, the source region 1240 is substantially aligned with the spacer 1286.

The gate oxide layer 1260 is formed on the semiconductor substrate 1210. In one embodiment, the gate oxide layer 1260 includes silicon oxide. In another embodiment, the thickness of the oxide layer 1260 ranges from 40 Å to 90 Å. The gate regions 1270 and 1272 are located on the gate oxide layer 1210. In one embodiment, the gate region 1270 is over the n-type well 1220, and the gate region 1272 is over the p-type well 1222. In another embodiment, the gate regions 1270 and 1272 each are doped either n-type or p-type. The dopant concentration may range from $1\times10^{18}$ cm$^{-3}$ to $2\times10^{19}$ cm$^{-3}$. In yet another embodiment, the thickness of the gate region 1270 or 1272 ranges from 1800 Å to 2200 Å.

The spacers 1280 and 1282 are next to the gate regions 1270, and the spacers 1284 and 1286 are next to the gate region 1272. In one embodiment, the spacers 1280 and 1282 are on at least part of the lightly doped regions 1236 and 1238 respectively. The spacers 1284 and 1286 are on at least part of the lightly doped regions 1239 and 1237 respectively. The thickness 1288 for the spacer 1280, 1282, 1284 or 1286 ranges from 1200 Å to 1800 Å. In another embodiment, the source region 1240 is substantially aligned with the spacer 1286.

The photodiode well 1290 is located under the gate oxide layer 1260 and in the semiconductor substrate 1210. In one embodiment, the photodiode well 1290 has p-type conductivity. In yet another embodiment, the photodiode well has a thickness ranging from 3000 Å to 5000 Å.

Figure 12A:
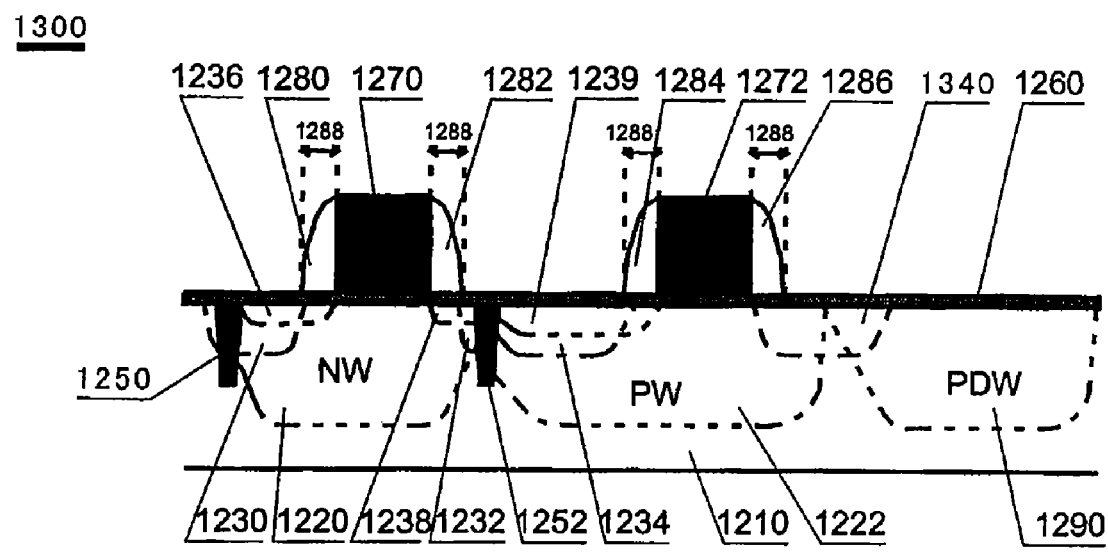
FIG. 12(a) is a simplified device for image sensing according to another embodiment of the present invention.

FIG. 12(a) is a simplified device for image sensing according to another embodiment of the present invention. The device 1300 includes the following components:

1. Substrate 1210;
2. Transistor wells 1220 and 1222;
3. Heavily doped regions 1230, 1232 and 1234;
4. Lightly doped regions 1236, 1238 and 1239;
5. Source region 1340;
6. Shallow trench isolations 1250 and 1252;
7. Gate oxide layer 1260;
8. Gate regions 1270 and 1272;
9. Spacers 1280, 1282, 1284, and 1286;
10. Photodiode well 1290.

The above group of components provide a device according to an embodiment of the present invention. Other alternatives can also be provided where components are added, one or more components are removed, or one or more components are provided in a different arrangement without departing from the scope of the claims herein. For example, a source follower, a selecting transistor, and a bias resistor are also provided to the device 1300. As another example, the device 1300 is fabricated according to the method 400 including at least the processes 455, 465 and 475. Future details of the present invention can be found throughout the present specification and more particularly below.

In one embodiment, the substrate 1210 is a semiconductor substrate, such as a silicon substrate. The transistor wells 1220 and 1222 are n-type and p-type respectively. For example, the depth of the n-type well 1220 ranges from 0.5 μm to 1.0 μm, and the doping concentration of the n-type well 1220 ranges from $5\times10^{16}$ cm$^{-3}$ to $3\times10^{17}$ cm$^{-3}$. The depth of the p-type well 1220 ranges from 0.5 μm to 1.0 μm, and the doping concentration of the p-type well 1222 ranges from $5\times10^{16}$ cm$^{-3}$ to $3\times10^{17}$ cm$^{-3}$.

The heavily doped regions 1230 and 1232 are formed on both sides of the gate region 1270 and are substantially self-aligned with the spacers 1280 and 1282 respectively. The heavily doped region 1234 is formed on only one side of the gate region 1272 and is substantially self-aligned with the spacer 1284. In one embodiment, the regions 1230 and 1232 are p-type, and the region 1234 is n-type. The region 1232 is separated from the region 1234 by the shallow trench isolation 1252. In another embodiment, the depth for the heavily doped region 1230 or 1232 ranges from 500 Å to 2000 Å, and the dopant concentration ranges from $1\times10^{18}$ cm$^{-3}$ to $2\times10^{19}$ cm$^{-3}$. The depth for the heavily doped region 1234 ranges from 500 Å to 2000 Å, and the dopant concentration ranges from $1\times10^{18}$ cm$^{-3}$ to $2\times10^{19}$ cm$^{-3}$.

The lightly doped regions 1236 and 1238 are located on both sides of the gate region 1270 and are substantially self-aligned with the gate region 1270. The lightly doped region 1239 is located on only one side of the gate region 1272 and is substantially aligned with the gate region 1272. In one embodiment, the regions 1236 and 1238 are p-type, and the region 1239 is n-type. The region 1238 is separated from the region 1239 by the shallow trench isolation 1252. In another embodiment, the depth for the lightly doped region 1236 or 1238 ranges from 500 Å to 1500 Å, and the dopant concentration ranges from $1\times10^{17}$ cm$^{-3}$ to $3\times10^{18}$ cm$^{-3}$. The depth for the lightly doped region 1239 ranges from 500 Å to 1500 Å, and the dopant concentration ranges from $1\times10^{17}$ cm$^{-3}$ to $3\times10^{18}$ cm$^{-3}$.

The source region 1340 is located in the semiconductor substrate 1210. In one embodiment, the source region 1340 is n-type. The depth for the source region 1340 ranges from 2000 Å to 3500 Å, and the dopant concentration ranges from $1\times10^{18}$ cm$^{-3}$ to $1\times10^{19}$ cm$^{-3}$. In another embodiment, the depth of the source region 1340 is different from the depth of the lightly doped source region 1239 and/or the depth of the heavily doped source region 1234. In yet another embodiment, the depth of the source region 1340 is larger than the depth of the lightly doped source region 1239. In yet another embodiment, the source region 1340 is substantially aligned with the gate region 1272.

The gate oxide layer 1260 is formed on the semiconductor substrate 1210. In one embodiment, the gate oxide layer 1260 includes silicon oxide. In another embodiment, the thickness of the oxide layer 1260 ranges from 40 Å to 90 Å. The gate regions 1270 and 1272 are located on the gate oxide layer 1210. In one embodiment, the gate region 1270 is over the n-type well 1220, and the gate region 1272 is over the p-type well 1222. In another embodiment, the gate regions 1270 and 1272 each are doped either n-type or p-type. The dopant concentration may range from $1\times10^{18}$ cm$^{-3}$ to $2\times10^{19}$ cm$^{-3}$. In yet another embodiment, the thickness of the gate region 1270 or 1272 ranges from 1800 Å to 2200 Å.

The spacers 1280 and 1282 are next to the gate regions 1270, and the spacers 1284 and 1286 are next to the gate region 1272. In one embodiment, the spacers 1280 and 1282 are on at least part of the lightly doped regions 1236 and 1238 respectively. The spacers 1284 and 1286 are on at least part of the lightly doped region 1239 and the source region 1340 respectively. The thickness 1288 for the spacer 1280, 1282, 1284 or 1286 ranges from 1200 Å to 1800 Å.

The photodiode well 1290 is located under the gate oxide layer 1260 and in the semiconductor substrate 1210. In one embodiment, the photodiode well 1290 has p-type conductivity. In yet another embodiment, the photodiode well has a thickness ranging from 3000 Å to 5000 Å.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for making an image sensor, the method comprising:
    forming a first well and a second well in a substrate, the first well and the second well being different;
    forming a gate oxide layer on the substrate;
    depositing a first gate region and a second gate region on the gate oxide layer, the first gate region being associated with the first well, the second gate region being associated with the second well;
    forming a third well in the substrate, the third well being associated with a photodiode;
    implanting a first plurality of ions to form a first lightly doped source region and a first lightly doped drain region in the first well;
    implanting a second plurality of ions to form at least a second lightly doped drain region in the second well; and
    implanting a third plurality of ions to form a source in the second well with a first implant dose ranging from $10^3$ $cm^{-2}$ to $10^5$ $cm^{-2}$, wherein the third plurality of ions are implanted before forming any spacers.

2. The method of claim 1 wherein the implanting a second plurality of ions and the implanting a third plurality of ions are two separate processes.

3. The method of claim 1 wherein the implanting a third plurality of ions is associated with a first implant energy ranging from 40 KeV to 80.

4. The method of claim 3 wherein the third spacer and the fourth spacer are capable of substantially preventing any of the third plurality of ions from penetrating the third spacer and the fourth spacer and entering the substrate.

5. The method of claim 1 wherein the implanting a second plurality of ions to further form a second lightly doped source region in the second well.

6. The method of claim 1, and further comprising:
    implanting a fourth plurality of ions to form a first heavily doped source region and a first heavily doped drain region in the first well;
    implanting a fifth plurality of ions to form a second heavily doped drain region in the second well;
    wherein the implanting a fifth plurality of ions is free from being associated with forming a second heavily doped source region adjacent to the source.

7. The method of claim 1 wherein the third plurality of ions comprises at least one selected from a group consisting of an arsenic ion and a phosphorous ion.

8. The method of claim 1 and further comprising:
    forming a first spacer and a second spacer associated with the first gate region;
    forming a third spacer and a fourth spacer associated with the second gate region;
    wherein
        the implanting a second plurality of ions is performed before the forming a third spacer and a fourth spacer and;
        the implanting a third plurality of ions is performed before the forming a third spacer and a fourth spacer.

9. The method of claim 1 wherein the source is substantially self-aligned with the second gate region.

10. A method for making an image sensor, the method comprising:
    forming a first well and a second well in a substrate, the first well and the second well being different;
    forming a gate oxide layer on the substrate;
    depositing a first gate region and a second gate region on the gate oxide layer, the first gate region being associated with the first well, the second gate region being associated with the second well;
    forming a third well in the substrate;
    implanting a first plurality of ions to form a first lightly doped source region and a first lightly doped drain region in the first well;
    implanting a second plurality of ions to form a second lightly doped drain region and a second lightly doped source region in the second well;
    forming a first spacer and a second spacer associated with the second gate region after implanting the second plurality of ions; and
    implanting a third plurality of ions to form a source in the second well after forming the first spacer, wherein the source has a depth that is deeper than a heavily doped drain region in the second well.

11. The method of claim 10 wherein the first spacer and the second spacer are capable of substantially preventing any of the third plurality of ions from penetrating the first spacer and the second spacer and entering the substrate.

12. The method of claim 11 wherein the source is substantially self-aligned with the second spacer.

13. A device for image sensing, the device comprising:
    a semiconductor substrate;
    a first well, a second well, and a third well in the semiconductor substrate, the first well and the second well being associated with a CMOS, the third well being associated with a photodiode, the first well and the second well being different;
    a gate oxide layer on the semiconductor substrate including the third well,
    a first gate region and a second gate region on the gate oxide, the first gate region and the second gate region being associated with the first well and the second well respectively;
    a first spacer and a second spacer adjacent to the second gate region;
    a first lightly doped drain region in the second well and associated with the second gate region, the first lightly doped drain region is substantially aligned with the second gate region;
    a first heavily doped drain region in the second well, aligned with the first spacer, and associated with the first lightly doped drain region; and
    a source in the second well and aligned with the second gate region.

14. The device of claim 13 wherein:
    the first heavily doped drain region is associated with a first depth;
    the source is associated with a second depth;
    the second depth is different from the first depth.

15. The device of claim 13 wherein the second depth ranges from 2000 Å to 3500 Å.

16. The device of claim 13 wherein the gate oxide layer is associated with a thickness ranging from 40 Å to 90 Å.

17. The device of claim 13 wherein a part of the gate oxide layer is on the third well, the part of the gate oxide layer is free from being in direct contact with another oxide layer.

18. The device of claim 13, and further comprising:
a second lightly doped drain region and a second lightly doped source region in the first well, the second lightly doped drain region and the second lightly doped source region being associated with the first gate region;
a second heavily doped drain region and a second heavily doped source region in the first well, the second heavily doped drain region and the second heavily doped source region being associated with the second lightly doped drain region and the second lightly doped source region respectively.

* * * * *